(12) United States Patent  
Ershov et al.

(10) Patent No.: US 8,901,523 B1  
(45) Date of Patent: Dec. 2, 2014

(54) APPARATUS FOR PROTECTING EUV OPTICAL ELEMENTS

(71) Applicant: Cymer LLC, San Diego, CA (US)

(72) Inventors: Alexander I. Ershov, Escondido, CA (US); Jeremy A. Burke, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/017,981

(22) Filed: Sep. 4, 2013

(51) Int. Cl.
| | |
|---|---|
| *A61N 5/06* | (2006.01) |
| *G01J 3/10* | (2006.01) |
| *H05G 2/00* | (2006.01) |
| *H01J 37/22* | (2006.01) |
| *G02B 27/00* | (2006.01) |

(52) U.S. Cl.  
CPC ............... *H05G 2/008* (2013.01); *H01J 37/22* (2013.01); *G02B 27/0006* (2013.01)  
USPC .................................. 250/504 R; 250/493.1

(58) Field of Classification Search  
USPC .................................. 250/504 R, 365, 493.1  
See application file for complete search history.

(56) References Cited

U.S. PATENT DOCUMENTS

| | | | | |
|---|---|---|---|---|
| 7,608,846 B2 * | 10/2009 | Nakano | ..................... | 250/504 R |
| 7,671,349 B2 * | 3/2010 | Bykanov et al. | .......... | 250/504 R |
| 8,624,208 B2 * | 1/2014 | Nagai et al. | ............... | 250/504 R |

* cited by examiner

*Primary Examiner* — Jack Berman  
*Assistant Examiner* — Meenakshi Sahu  
(74) *Attorney, Agent, or Firm* — Arent Fox LLP

(57) ABSTRACT

Apparatus having a chamber with an interior wall and a region within the chamber from which a contaminating material emanates when the apparatus is in operation. A plurality of vanes is positioned on a portion of the interior wall, each of the vanes having a first surface which is oriented along a direction between the vane and the region and a second surface adjacent the first surface which is oriented to deflect the contaminating material striking the second surface away from the region, the second surfaces being dimensioned and juxtaposed with respect to one another such that the second surfaces substantially prevent the contaminating material from striking the portion of the interior wall. At least part of each of the vanes may be covered with a mesh. The vanes may be heated, and may be heated at least to a melting point of the contaminating material. The apparatus is especially applicable to protecting multilayer mirrors serving as collectors in systems for generating EUV light for use in semiconductor photolithography.

32 Claims, 4 Drawing Sheets

APPARATUS FOR PROTECTING EUV OPTICAL ELEMENTS

FIELD

The present disclosure relates to protection of optical elements that operate in environments in which they are subject to contamination. An example of such an environment is the vacuum chamber of an apparatus for generating extreme ultraviolet ("EUV") radiation from a plasma created through discharge or laser ablation of a source material. In this application, the optical elements are used, for example, to collect and direct the radiation for utilization outside of the vacuum chamber, e.g., for semiconductor photolithography.

BACKGROUND

EUV light, e.g., electromagnetic radiation having wavelengths of around 50 nm or less (also sometimes referred to as soft x-rays), and including light at a wavelength of about 13.5 nm, can be used in photolithography processes to produce extremely small features in substrates such as silicon wafers. Here and elsewhere, it will be understood that the term "light" is used to encompass electromagnetic radiation outside of the visible part of the spectrum.

Methods for generating EUV light include converting a source material from a liquid state into a plasma state. The source material preferably includes at least one element, e.g., xenon, lithium or tin, with one or more emission lines in the EUV range. In one such method, often termed laser produced plasma ("LPP"), the required plasma can be produced by using a laser beam to irradiate a source material having the required line-emitting element.

One LPP technique involves generating a stream of source material droplets and irradiating at least some of the droplets with laser light pulses. In more theoretical terms, LPP light sources generate EUV radiation by depositing laser energy into a source material having at least one EUV emitting element, such as xenon (Xe), tin (Sn), or lithium (Li), creating a highly ionized plasma with electron temperatures of several 10's of eV.

The energetic radiation generated during de-excitation and recombination of these ions is emitted from the plasma in all directions. In one common arrangement, a near-normal-incidence mirror (often termed a "collector mirror" or simply a "collector") is positioned to collect, direct (and in some arrangements, focus) the light to an intermediate location. The collected light may then be relayed from the intermediate location to a set of scanner optics and ultimately to a wafer.

In the EUV portion of the spectrum reflective optics are usually used for the collector. At the wavelengths involved, the collector is advantageously implemented as a multi-layer mirror ("MLM"). As its name implies, this MLM is generally made up of alternating layers of material over a foundation or substrate.

The optical element must be placed within the vacuum chamber with the plasma to collect and redirect the EUV light. The environment within the chamber is inimical to the optical element and so limits its useful lifetime, for example, by reducing its reflectivity. An optical element within the environment may be exposed to high energy ions or particles of source material. The particles of source material can contaminate the optical element's exposed surface. Particles of source material can also cause physical damage and localized heating of the MLM surface. The source materials may be particularly reactive with a material making up at least one layer of the MLM, e.g., molybdenum and silicon. Temperature stability, ion-implantation and diffusion problems may need to be addressed even with less reactive source materials, e.g., tin, indium, or xenon.

Several techniques have been employed to increase optical element lifetime despite these harsh conditions. For example, protective layers or intermediate diffusion barrier layers may be used to isolate the MLM layers from the environment. The collector may be heated to an elevated temperature of, e.g., up to 500° C., to evaporate debris from its surface. The collector surface may be cleaned using hydrogen radicals. An etchant may be employed e.g., a halogen etchant, to etch debris from the collector surfaces and create a shielding plasma in the vicinity of the reflector surfaces.

Another technique which may be employed is to reduce the likelihood that contaminating source material reaches the collector surface. Source material may accumulate on the interior surfaces of the vessel. This source material may reach the collector through the influence of gravity. There is a need to protect the system from this material. For example, some systems use vanes to protect the collector from micro-droplets of source material created during plasma generation. It is possible in such a system, however, for source material to accumulate on the vanes. This in turn creates the possibility that accumulated source material will detach from the vanes and impinge on the surface of the collector, especially when the system for dispensing source material into the vessel is deployed at a large angle from vertical.

There remains a need to extend collector lifetime by protecting the surfaces of optical elements from source material in systems for generating EUV light. With this in mind, applicants disclose arrangements for improved protection of surfaces of optical elements.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

In one aspect, there is provided an apparatus having a chamber with an interior wall and a region within the chamber from which a contaminating material emanates when the apparatus is in operation. A plurality of vanes is positioned on a portion of the interior wall, each of the vanes having a first surface which is oriented along a direction between the vane and the region and a second surface adjacent the first surface which is oriented to deflect the contaminating material striking the second surface away from the region, the second surfaces being dimensioned and juxtaposed with respect to one another such that the second surfaces substantially prevent the contaminating material from striking the portion of the interior wall. The vanes may be made of a material such as molybdenum or stainless steel and may be covered with an inert material such as gold. At least part of each of the vanes may be covered with a mesh. The mesh may be made of a material such as molybdenum or stainless steel and may be covered with an inert material such as gold.

The vanes may be heated, and may be heated at least to a melting point of the contaminating material. Each of the vanes may include an electrical resistive element, and the vane may be heated by supplying current to the electrical resistive heater. Alternatively or in addition each of the vanes may include an internal fluid channel and the vane may be heated by causing heated fluid to flow in the internal fluid channel.

At least part of each of the vanes may be covered with a mesh and is heated at least to a melting point of the contaminating material. Each of said vanes may be in fluid communication with a vessel for collecting the contaminating material and the mesh may be arranged to direct liquid contaminating material to the vessel.

In another aspect, there is provided an apparatus for generating light useful for semiconductor fabrication by generating a plasma from a source material, the apparatus having a chamber with an interior wall and a region within the chamber from which source material emanates when the apparatus is in operation. A plurality of vanes may be positioned on a portion of the interior wall, each of the vanes having a first surface which is oriented along a direction between the vane and the region and a second surface adjacent the first surface which is oriented to deflect the source material striking the second surface away from the region, the second surfaces being dimensioned and juxtaposed with respect to one another such that the second surfaces substantially prevent the source material from striking the portion of the interior wall. The vanes may be made of a material such as molybdenum or stainless steel and may be covered with an inert material such as gold. At least a portion of each of the vanes may be covered with a mesh. The mesh may be made of a material such as molybdenum or stainless steel and may be covered with an inert material such as gold.

The vanes may be heated and, in particular, may be heated at least to a melting point of the source material. Each of the vanes may include an electrical resistive element, in which case the vane may be heated by supplying current to the electrical resistive heater. Each of the vanes may include an internal fluid channel, in which case the vane may be heated by causing heated fluid to flow in the internal fluid channel. Each of the vanes may be in fluid communication with a vessel for collecting the source material and the mesh may be arranged to direct liquid source material to the vessel.

In yet another aspect there is provided an apparatus for generating light useful for semiconductor fabrication by generating a plasma from a source material, the apparatus having a chamber with an interior wall and a region within the chamber from which source material will emanate when the apparatus is in operation. A first vane may be positioned on a first portion of the interior wall, the vane having a first vane tangential surface which is oriented along a first direction between the first vane and the region and a first vane shielding surface adjacent the first vane tangential surface which is oriented to deflect the source material striking the first vane shielding surface away from the region. A second vane may be positioned on a second portion of the interior wall, the second vane having a second vane tangential surface which is oriented along a second direction different from the first direction between the second vane and the region and a second vane blocking surface adjacent the second vane tangential surface which is oriented to deflect the source material striking the second vane shielding surface away from the region. The vanes may be made of a material such as molybdenum or stainless steel and may be covered with an inert material such as gold. The first vane shielding surface and the second vane shielding surface are dimensioned and juxtaposed with respect to one another such that the first vane shielding surface and the second vane shielding surface substantially prevent the source material from striking the first and second portions of the interior wall.

At least a portion of the first and second vanes may be covered with a mesh. The mesh may be made of a material such as molybdenum or stainless steel and may be covered with an inert material such as gold. Each of the first and second vanes may be heated. At least a portion of the first and second vanes may be covered with a mesh and each of said first and second vanes may be heated at least to a melting point of the source material.

DETAILED DESCRIPTION

Figure 1:
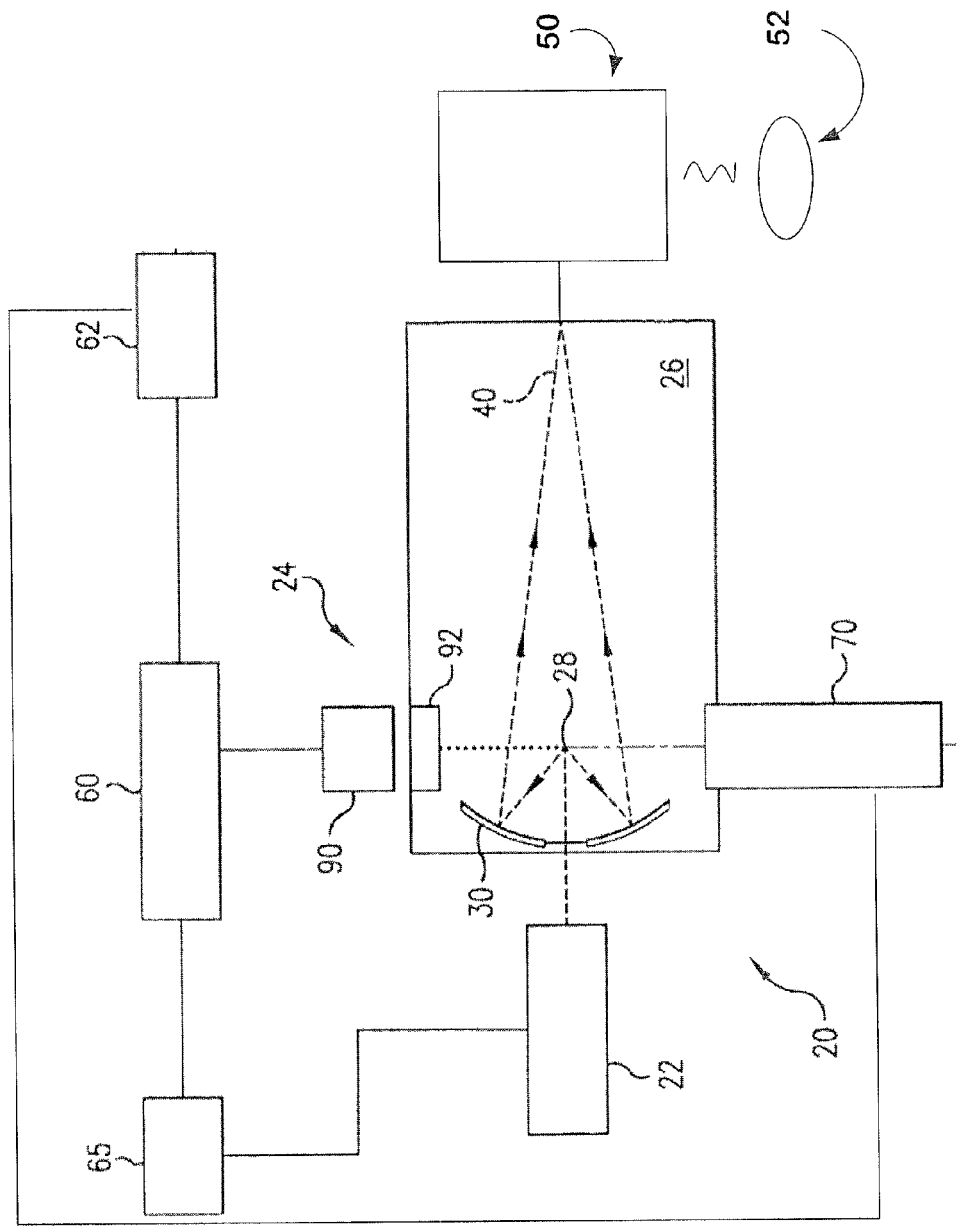
FIG. 1 shows a schematic, not to scale, view of an overall broad conception for a laser-produced plasma EUV light source system according to an aspect of the present invention.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram foam in order to facilitate description of one or more embodiments.

With initial reference to FIG. 1 there is shown a schematic view of an exemplary EUV light source, e.g., a laser produced plasma EUV light source 20 according to one aspect of an embodiment of the present invention. As shown, the EUV light source 20 may include a pulsed or continuous laser source 22, which may for example be a pulsed gas discharge $CO_2$ laser source producing radiation at 10.6 μm. The pulsed gas discharge $CO_2$ laser source may have DC or RF excitation operating at high power and high pulse repetition rate.

The EUV light source 20 also includes a source delivery system 24 for delivering source material in the form of liquid droplets or a continuous liquid stream. The source material may be made up of tin or a tin compound, although other materials could be used. The source delivery system 24 introduces the source material into the interior of a vessel or chamber 26 to an irradiation region 28 where the source material may be irradiated to produce plasma. In some cases, an electrical charge is placed on the source material to permit the source material to be steered toward or away from the irradiation region 28. It should be noted that as used herein an irradiation region is a region where source material irradiation may occur, and is an irradiation region even at times when no irradiation is actually occurring.

Continuing with FIG. 1, the light source 20 may also include one or more optical elements such as a collector 30. The collector 30 may be a normal incidence reflector, for example, implemented as a multilayer mirror ("MLM"), that is, a silicon carbide (SiC) substrate coated with a Mo/Si multilayer with additional thin barrier layers deposited at each interface to effectively block thermally-induced interlayer diffusion. Other substrate materials, such as Al or Si, can also be used. The collector 30 may be in the form of a prolate ellipsoid, with an aperture to allow the laser light to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV light may be output from the EUV light source 20 and input to, e.g., an integrated circuit lithography tool 50 which uses the light, for example, to process a silicon wafer workpiece 52 in a known manner. The silicon wafer workpiece 52 is then additionally processed in a known manner to obtain an integrated circuit device.

As described above, one of the technical challenges in the design of an optical element such as the collector 30 is extending its lifetime. The surface of the collector, which is usually a coating, becomes contaminated with source material, e.g., tin. One source of this contaminating source material is source material detaching from surfaces within the vessel 26 where it has accumulated. It is thus desirable to prevent this source material from accumulating on the interior surfaces of the vessel 26.

Figure 2:
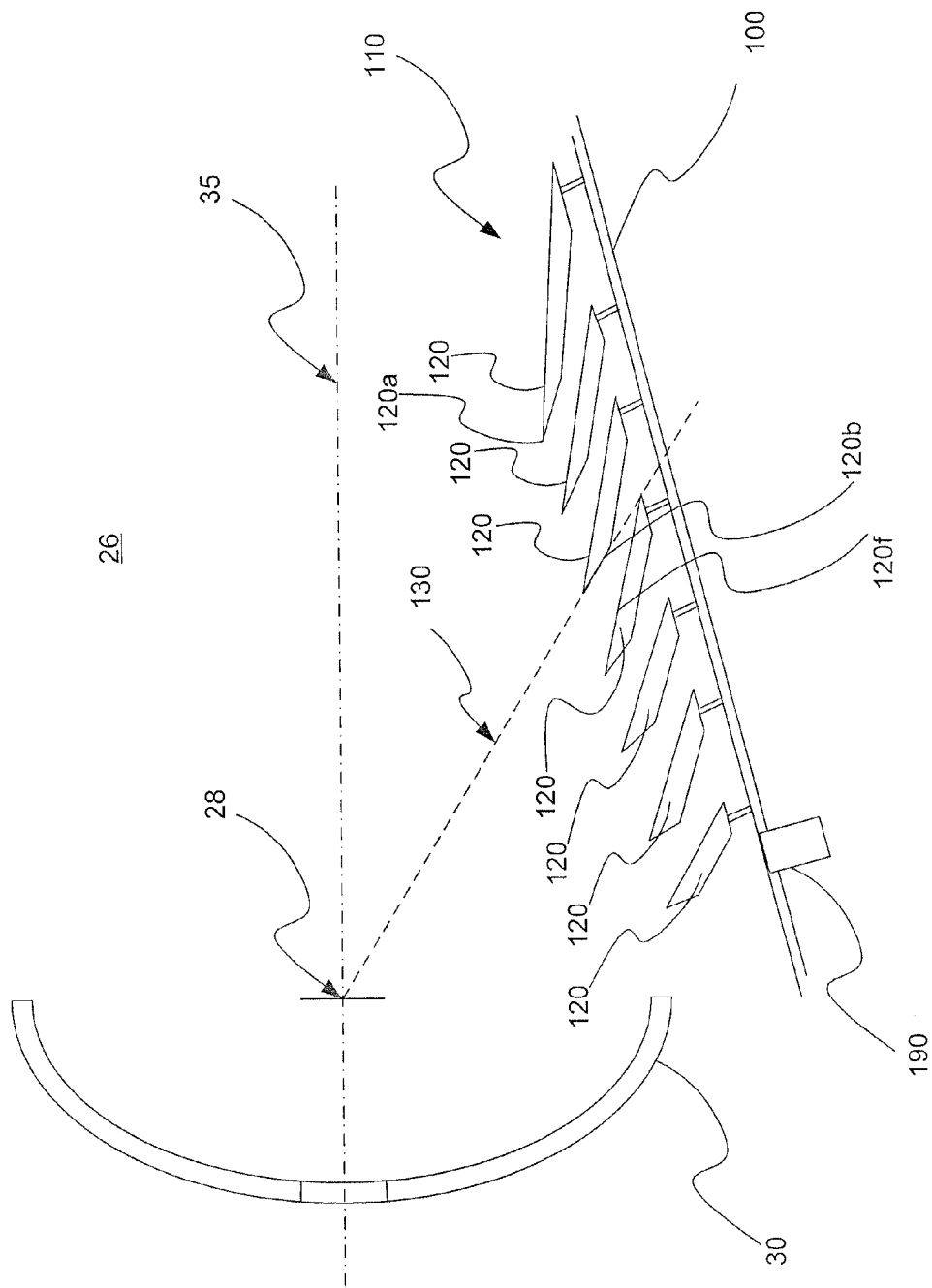
FIG. 2 is a not-to-scale side view of an optical element protection system according to one aspect of the present invention.

To achieve this end, in one embodiment, an array of vane-like structures is arranged on the interior surface of the vessel 26. Such an arrangement is shown in FIG. 2. FIG. 2 shows a collector 30 arranged to redirect light from an irradiation region 28 as in FIG. 1. Also shown is an optical axis 35 for the collector 30. FIG. 2 shows a segment of the wall 100 of the vessel 26 on which an array 110 of vanes 120 is arranged. FIG. 2 shows only the lowermost portion of the vessel 26. One of ordinary skill in the art will readily appreciate, however, that the array 110 may be placed additionally or alternatively on the side and upper portions of the vessel 26. If the vessel 26 has a cylindrical shape with the axis of the cylinder parallel to the optical axis 35, the array 110 may cover the entire interior surface of the vessel 26. Also, although the arrangement of vanes 120 is referred to herein as an array, this term is not intended to connote that the spacing between and the sizes of the vanes 120 are regular. It will be readily appreciated by one of ordinary skill in the art that the number, spacing, and size of the vanes 120 may be altered without departing from the principles of the invention.

The vanes 120 preferably made from a material that is resistant to corrosion such as stainless steel or molybdenum. The vanes 120 can also be coated with an inert material such as gold.

Figure 3:
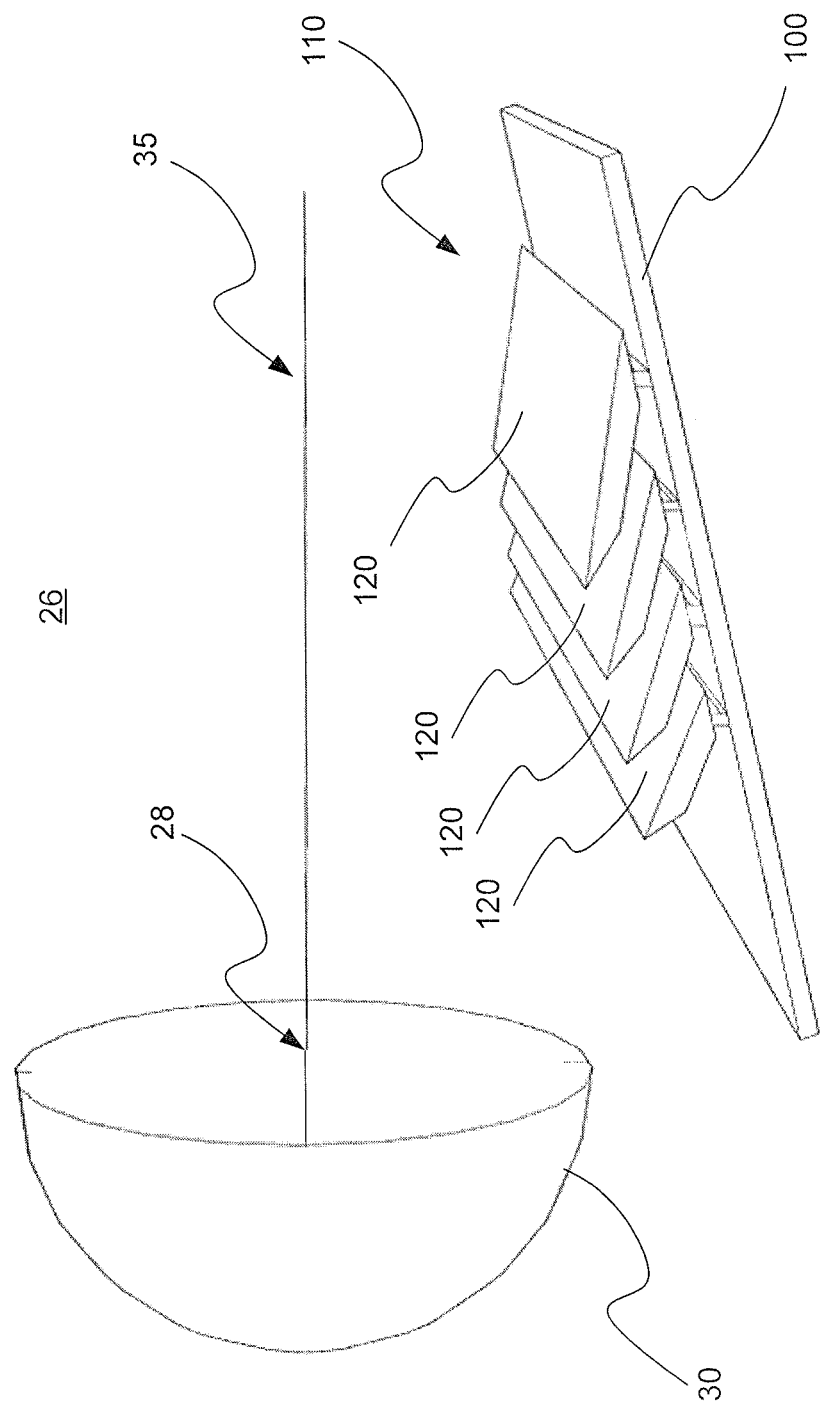
FIG. 3 is a not-to-scale perspective view of an optical element protection system according to one aspect of the present invention.

FIG. 3 is a perspective view of an arrangement such as that shown in FIG. 2 where like numerals refer to like elements. As can be seen, the vanes 120 extend laterally across the wall 100 is such a way that microdroplets of contaminating material necessarily strike the vanes 120 and are deflected away from irradiation region 28 and collector 30.

Figure 4:
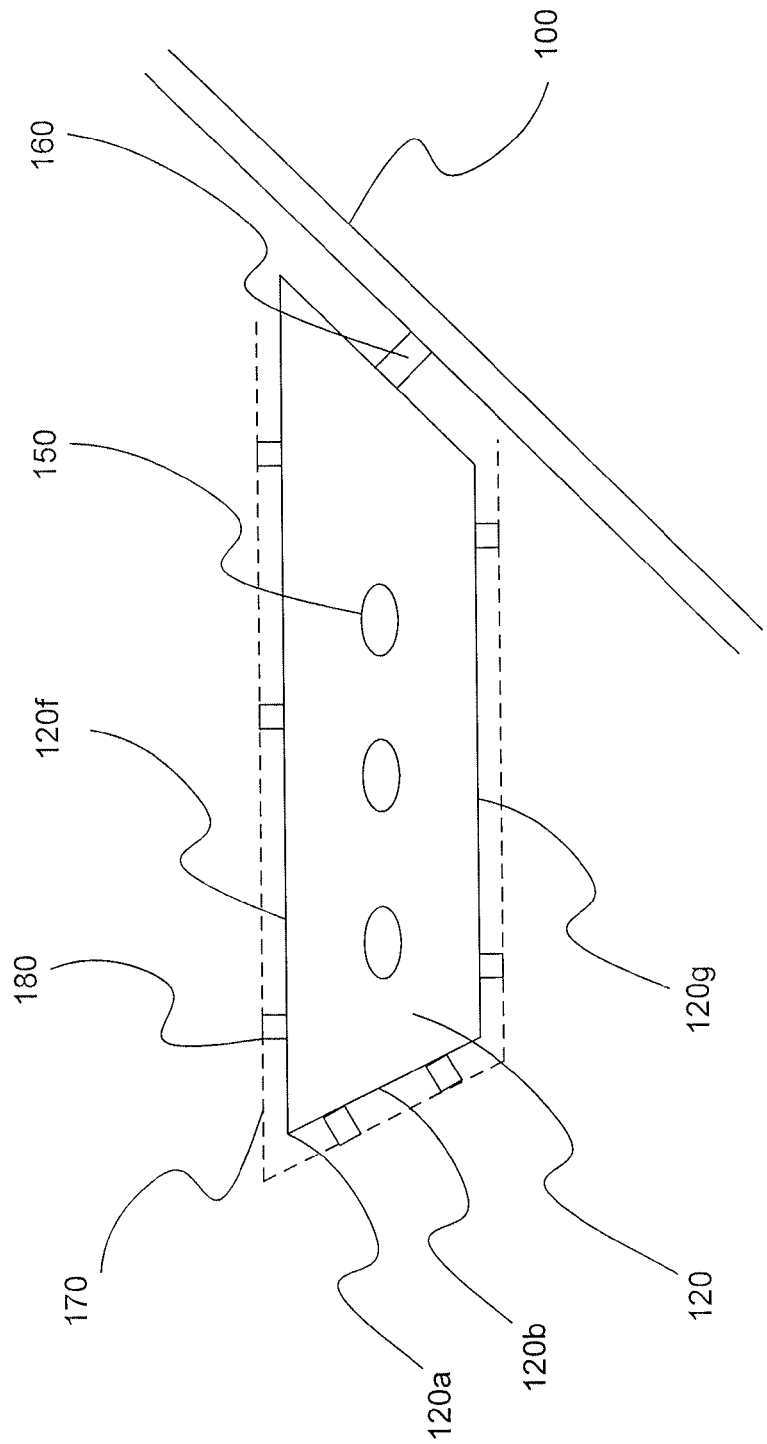
FIG. 4 is not-to-scale cutaway side view of some of the elements shown in FIG. 2 and FIG. 3.

As can be seen, in a presently preferred embodiment each vane 120 has a substantially trapezoidal cross-section. Referring to FIG. 4, the vane 120 has a first edge 120a that points generally towards the irradiation region 28. Each vane 120 also has a back side 120b that extends in a direction towards the irradiation region 28. Each vane also has a front side 120f that is tilted so that source material from the irradiation region 28, typically in the form of micro-droplets of source material, will be deflected in a direction away from the irradiation region 28 and, hence, away from the collector 30.

The front surface 120f is dimensioned and positioned so that it extends generally laterally at least until it touches an imaginary line 130 extending from the center of the irradiation region 28 and tangential to a back surface 120b of an adjacent vane. This is shown in FIG. 2. In other words, the front surface 120f of a first vane 120 and back surface 120b of an adjacent vane 120 are arranged and dimensioned so that droplets of source material emanating from the irradiation region 28 can strike only the front surface 120f of a vane 120 and cannot strike the portion of the interior surface of the wall 100. The physical gap between adjacent vanes 120 is thus covered by the extension of the front surface 120f. This is because the back surface 120b is arranged to be substantially tangential to the path of the droplets, and the front surfaces together occlude the interior surface of wall 100 of the vessel 26.

As shown in FIG. 4, in a presently preferred embodiment the vanes 120 have a substantial thickness as measured between the front surface 120f and an opposing surface 120g. This thickness can be between about 3 mm and about 50 mm or even larger. In a presently preferred embodiment, this thickness is preferably in the range of about 6 mm to about 25 mm and more preferably in the range of about 10 mm to about 25 mm.

Also, as shown in FIG. 4, the vane 120 is preferably provided with one or more heating elements 150. These heating elements 150 are placed within the vane 120 to permit heating of the vane 120, preferably at least to the melting point of the source material. In instances in which the source material is tin, it is preferred to heat the vane 120 at least up to the melting point of tin (231.9° C.) and more preferably to a temperature in the range of about 250° C. to about 350° C. The heating elements 150 may be electric or may be conduits for the flow of a heated gas or liquid. In the case of electric heating elements 150, the heating elements 150 may be supplied with power through a feedthrough 160. In the case of heating elements 150 in the form of conduits, the heated fluid may be supplied through the feedthrough 160. As shown, the feedthrough 160 may also support the vane 120. Alternatively, the vane 120 can be supported by separate supporting hardware (not shown).

According to another aspect of a preferred embodiment of the invention, one or more of the vanes 120 are also provided with a wire mesh 170. The purpose of the mesh 170 is to trap and retain source material that strikes the vanes 120. Another purpose of the mesh 170 is to direct the flow of source material that strikes the vanes 120 to a desired location within the vessel 26 such as a source material collection sump 190 as shown in FIG. 2. The source material collection sump 190 may be configured as a port supplied with a freeze valve.

The materials for the mesh 170 are chosen to optimize these functions. For example, the mesh 170 is preferably made from a material that is resistant to corrosion such as stainless steel or molybdenum. The mesh 170 can also be coated with an inert material such as gold. In the instances in which the mesh 170 is made up of wires, the diameter of the wire making up the mesh 170 is preferably in the range of about 100 microns to 1 mm. The mesh opening size is preferably in the range of about 100 microns to about 2 mm. The percentage opening of the wire mesh 170 is preferably equal to or greater than 50%.

As shown in FIG. 4, the mesh 170 can be attached to the vane 120 at several points using attachment members 180. The attachment members 180 may be dimensioned to maintain a gap of constant width between the mesh 180 and the opposing surface of the vane 120, or may be dimensioned so that the gap width varies in a desired fashion.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. An apparatus for protecting EUV optical elements comprising:
   a chamber having an interior wall;
   a region within said chamber from which a contaminating material emanates when said apparatus is in operation;
   a plurality of vanes positioned on a portion of said interior wall, each of said vanes having a first surface which is oriented along a direction between said vane and said region and a second surface adjacent said first surface which is oriented to deflect said contaminating material striking said second surface away from said region, said second surfaces being dimensioned and juxtaposed with respect to one another such that said second surfaces substantially prevent said contaminating material from striking said portion of said interior wall.

2. The apparatus as claimed in claim 1 wherein each of said vanes is made from a material taken from the group consisting of molybdenum and stainless steel.

3. The apparatus as claimed in claim 1 wherein each of said vanes is covered with an inert material.

4. The apparatus as claimed in claim 3 wherein said inert material is gold.

5. The apparatus as claimed in claim 1 wherein at least part of each of said vanes is covered with a mesh.

6. The apparatus as claimed in claim 5 wherein said mesh is made from a material taken from the group consisting of molybdenum and stainless steel.

7. The apparatus as claimed in claim 5 wherein said mesh is covered with an inert material.

8. The apparatus as claimed in claim 7 wherein said inert material is gold.

9. The apparatus as claimed in claim 1 wherein each of said vanes is heated.

10. The apparatus as claimed in claim 9 wherein each of said vanes is heated at least to a melting point of said contaminating material.

11. The apparatus as claimed in claim 9 wherein said vane includes an electrical resistive element, and said vane is heated by supplying current to said electrical resistive heater.

12. The apparatus as claimed in claim 9 wherein said vane includes an internal fluid channel and said vane is heated by causing heated fluid to flow in said internal fluid channel.

13. The apparatus as claimed in claim 1 wherein at least part of each of said vanes is covered with a mesh and is heated at least to a melting point of said contaminating material.

14. The apparatus as claimed in claim 13 wherein each of said vanes is in fluid communication with a vessel for collecting said contaminating material and said mesh is arranged to direct liquid contaminating material to said vessel.

15. An apparatus for generating light useful for semiconductor fabrication by generating a plasma from a source material, said apparatus comprising:
    a chamber having an interior wall;
    a region within said chamber from which source material emanates when said apparatus is in operation;
    a plurality of vanes positioned on a portion of said interior wall, each of said vanes having a first surface which is oriented along a direction between said vane and said region and a second surface adjacent said first surface which is oriented to deflect said source material striking said second surface away from said region, said second surfaces being dimensioned and juxtaposed with respect to one another such that said second surfaces substantially prevent said source material from striking said portion of said interior wall.

16. The apparatus as claimed in claim 15 wherein each of said vanes is made from a material taken from the group consisting of molybdenum and stainless steel.

17. The apparatus as claimed in claim 15 wherein each of said vanes is covered with an inert material.

18. The apparatus as claimed in claim 17 wherein said inert material is gold.

19. The apparatus as claimed in claim 15 wherein at least part of each of said vanes is covered with a mesh.

20. The apparatus as claimed in claim 19 wherein said mesh is made from a material taken from the group consisting of molybdenum and stainless steel.

21. The apparatus as claimed in claim 19 wherein said mesh is covered with an inert material.

22. The apparatus as claimed in claim 21 wherein said inert material is gold.

23. The apparatus as claimed in claim 15 wherein each of said vanes is heated.

24. The apparatus as claimed in claim 23 wherein each of said vanes is heated at least to a melting point of said source material.

25. The apparatus as claimed in claim 23 wherein said vane includes an electrical resistive element, and said vane is heated by supplying current to said electrical resistive heater.

26. The apparatus as claimed in claim 23 wherein said vane includes an internal fluid channel and said vane is heated by causing heated fluid to flow in said internal fluid channel.

27. The apparatus as claimed in claim 15 wherein at least part of each of said vanes is covered with a mesh and each of said vanes is heated at least to a melting point of said source material.

28. The apparatus as claimed in claim 27 wherein each of said vanes is in fluid communication with a vessel for collecting said source material and said mesh is arranged to direct liquid source material to said vessel.

29. An apparatus for generating light useful for semiconductor fabrication by generating a plasma from a source material, said apparatus comprising:
    a chamber having an interior wall;
    a region within said chamber from which source material emanates when said apparatus is in operation;
    a first vane positioned on a first portion of said interior wall, said vane having a first vane tangential surface which is oriented along a first direction between said first vane and said region and a first vane shielding surface adjacent said first vane tangential surface which is oriented to deflect said source material striking said first vane shielding surface away from said region;
    a second vane positioned on a second portion of said interior wall, said second vane having a second vane tangential surface which is oriented along a second direction different from said first direction between said second vane and said region and a second vane blocking surface adjacent said second vane tangential surface which is oriented to deflect said source material striking said second vane shielding surface away from said region;

said first vane shielding surface and said second vane shielding surface being dimensioned and juxtaposed with respect to one another such that said first vane shielding surface and said second vane shielding surface substantially prevent said source material from striking said first and second portions of said interior wall.

30. The apparatus as claimed in claim 29 wherein at least part of each of said first and second vanes is covered with a mesh.

31. The apparatus as claimed in claim 29 wherein each of said first and second vanes is heated.

32. The apparatus as claimed in claim 29 wherein at least part of each of said first and second vanes is covered with a mesh and each of said first and second vanes is heated at least to a melting point of said source material.

* * * * *